US010545173B2

(12) United States Patent
White et al.

(10) Patent No.: US 10,545,173 B2
(45) Date of Patent: Jan. 28, 2020

(54) BALUNLESS TEST FIXTURE

(71) Applicant: COMMSCOPE CONNECTIVITY UK LIMITED, Dorcan, Swindon (GB)

(72) Inventors: Gordon John White, Gloucester (GB); Bernard Harold Hammond, Jr., Cheltenham (GB); Ian Robert George, Churchdown (GB)

(73) Assignee: CommScope Connectivity UK Limited, Dorcan, Swindon (GB)

( * ) Notice: Subject to any disclaimer, the term of this patent is extended or adjusted under 35 U.S.C. 154(b) by 0 days.

(21) Appl. No.: 15/039,836

(22) PCT Filed: Nov. 26, 2014

(86) PCT No.: PCT/EP2014/075611
§ 371 (c)(1),
(2) Date: May 26, 2016

(87) PCT Pub. No.: WO2015/078887
PCT Pub. Date: Jun. 4, 2015

(65) Prior Publication Data
US 2017/0003317 A1 Jan. 5, 2017

Related U.S. Application Data

(60) Provisional application No. 61/909,147, filed on Nov. 26, 2013.

(51) Int. Cl.
G01R 1/04 (2006.01)
G01R 1/067 (2006.01)
G01R 1/073 (2006.01)

(52) U.S. Cl.
CPC ....... *G01R 1/0408* (2013.01); *G01R 1/06733* (2013.01); *G01R 1/07307* (2013.01)

(58) Field of Classification Search
CPC .............. G01R 1/0408; G01R 1/06733; G01R 1/07307
See application file for complete search history.

(56) References Cited

U.S. PATENT DOCUMENTS 5,241,277 A 8/1993 Kefalas
5,931,048 A * 8/1999 Slocum .............. G01R 31/2887
248/178.1
(Continued)

OTHER PUBLICATIONS

International Search Report for International Application No. PCT/EP2014/075611 dated Feb. 11, 2015 (3 pages).
(Continued)

*Primary Examiner* — Akm Zakaria
(74) *Attorney, Agent, or Firm* — Merchant & Gould P.C.

(57) ABSTRACT

A test fixture and method of its use are disclosed. The test fixture includes a test fixture frame including a first test fixture mount having a first test head mounted thereon, the first test head slidable along a first axis, and a second test fixture mount having a second test head mounted thereon that is slidable along a second axis perpendicular to the first axis. The test fixture further includes a first test plate holder mounted to the first test head and including a clamping mechanism, as well as a probe mounting plate mounted to the first test plate holder and retained by the clamping mechanism and including a plurality of radially-disposed probe receptacles. The test fixture includes a plurality of probe assemblies received in corresponding probe receptacles, each including a probe extending at least partially through the probe mounting plate, each electrically connecting to a design under test.

18 Claims, 24 Drawing Sheets

(56) References Cited

U.S. PATENT DOCUMENTS

| | | | |
|---|---|---|---|
| 6,037,787 A * | 3/2000 | Corwith | G01R 1/07371 |
| | | | 324/756.04 |
| 6,407,542 B1 | 6/2002 | Conte | |
| 6,472,885 B1 * | 10/2002 | Green | G01N 22/00 |
| | | | 324/638 |
| 6,900,649 B1 | 5/2005 | Knauer | |
| 2002/0093355 A1 * | 7/2002 | Parker | G01R 1/07314 |
| | | | 324/755.05 |
| 2004/0100279 A1 * | 5/2004 | Talanov | G01R 31/311 |
| | | | 324/637 |
| 2005/0046412 A1 | 3/2005 | Appen et al. | |
| 2005/0212544 A1 | 9/2005 | Nakajima | |
| 2007/0096756 A1 * | 5/2007 | Parrish | G01R 1/07378 |
| | | | 324/754.18 |
| 2008/0233769 A1 * | 9/2008 | Grover | G01R 31/2889 |
| | | | 439/55 |
| 2010/0150358 A1 * | 6/2010 | Valenti, III | H04R 29/00 |
| | | | 381/58 |
| 2011/0316631 A1 * | 12/2011 | Rafi | H03F 3/19 |
| | | | 330/277 |
| 2015/0168531 A1 * | 6/2015 | Ku | G01R 35/005 |
| | | | 324/750.02 |
| 2015/0260758 A1 * | 9/2015 | Leikermoser | G01R 31/31905 |
| | | | 324/758.04 |

OTHER PUBLICATIONS

International Written Opinion for International Application No. PCT/EP2014/075611 dated Feb. 11, 2015 (13 pages).

Telecommunications Industry Association. "Measurement methods and test fixtures for balun-less measurements of balanced components and systems." Aug. 6, 2012, pp. 1-59.

* cited by examiner

BALUNLESS TEST FIXTURE

CROSS-REFERENCE TO RELATED APPLICATION(S)

This application is a National Stage of PCT/EP2014/075611, filed Nov. 26, 2014, which claims benefit of U.S. Patent Application Ser. No. 61/909,147 filed on Nov. 26, 2013, the disclosures of which are incorporated herein by reference in their entireties To the extent appropriate, a claim of priority is made to each of the above disclosed applications.

TECHNICAL FIELD

The present application relates generally to a testing feature for networking equipment, and in particular to a balunless test fixture useable to test communication or networking equipment in twisted pair systems.

BACKGROUND

International standard ISO/IEC 11801 specifies general-purpose telecommunication cabling systems (structured cabling) that are suitable for a wide range of applications (analog and ISDN telephony, various data communication standards, building control systems, factory automation). The ISO/IEC standard covers both balanced copper cabling and optical cabling.

The standard defines several classes, or categories, of twisted-pair copper interconnects, which differ in the maximum frequency for which a certain channel performance is required. For example, category 5e utilizes frequencies up to 100 MHz, while category 6 utilizes frequencies up to 250 MHz. Category 6a utilizes frequencies up to 500 MHz, and category 7 uses frequencies of up to 1 GHz.

Telecommunication cabling systems, when implemented using electrical signals, utilize twisted pair wiring and electrical connectors to form communication channels between computing systems, routers, or other telecommunications and networking equipment. The wiring, formed as cables, as well as the electrical connectors, is required to meet electrical performance criteria set by such ISO standards. When telecommunications equipment, including telecommunications connectors, is manufactured, such equipment is typically tested to ensure compliance with electrical performance characteristics.

Existing systems that are used to test the electrical performance of twisted pair connectors or other networking devices typically use a test station that transmits electrical signals to the design under test, and measures the resulting electrical performance of that design. Such systems generally include a balun, which is a type of electrical transformer that converts differential electrical signals to single-ended (e.g., grounded) electrical signals, and vice versa. Such baluns are used in test fixtures to translate test signals to differential signals for transmission through the networking equipment to test its performance.

As signal frequencies increase, use of baluns increasingly becomes problematic. This is because the baluns included in such circuitry introduce some signal degradation (e.g., crosstalk and common-mode effects) leading to signal loss. Although this is not a substantial effect at lower frequencies and within more generous signal loss thresholds available in category 5, 5e, 6, or even 6a frequencies, when signal frequencies are at 1 GHz or higher, the signal degradation attributable to the balun represents a greater proportion of the overall loss in the test circuit. This is both because of the increased signal degradation attributed to the balun at high frequencies, as well as the increased performance requirements of such high frequency standards. In either case, use of baluns to convert between single-ended and differential signals can obscure the actual performance characteristics of the networking equipment design under test.

For these and other reasons, improvements are desirable.

SUMMARY

In accordance with the following disclosure, the above and other issues are addressed by the following:

In a first aspect, a test fixture for electrical equipment includes a test fixture frame including a first test fixture mount having a first test head mounted thereon, the first test head slidable along a first axis, and a second test fixture mount having a second test head mounted thereon, the second test head slidable along a second axis perpendicular to the first axis. The test fixture further includes a first test plate holder mounted to the first test head, the first test plate holder including a clamping mechanism, as well as a probe mounting plate mounted to the first test plate holder and retained by the clamping mechanism, the probe mounting plate including a plurality of radially-disposed probe receptacles. The test fixture also includes a plurality of probe assemblies received in corresponding probe receptacles, each of the probe assemblies including a probe extending at least partially through the probe mounting plate, each probe electrically connecting to a design under test.

In a second aspect, a method of testing electrical performance of an electrical connector is disclosed. The method includes mounting a probe mounting plate to a test plate holder retained by a test head of a test fixture mount, the probe mounting plate including a plurality of radially-disposed probe receptacles having a plurality of probe assemblies received therethrough, each probe assembly including a coaxial probe. The method also includes mounting a probe plate to a termination plate and the probe mounting plate, the probe plate having a design under test mounted thereto, wherein mounting the probe plate and termination plate to the probe mounting plate electrically connects the design under test to the coaxial probes of the plurality of probe assemblies. The method further includes clamping the probe plate, termination plate, and probe mounting plate to the test plate holder using a slidable clamping mechanism. The method includes testing electrical performance of the design under test based on signals sent or received via the probe assemblies.

In a third aspect, a test fixture for testing signal performance of a twisted pair connector is disclosed. The test fixture includes a test fixture frame including first and second test fixture mounts having first and second rest heads, respectively, which are positioned and slideable along perpendicular axes. The test fixture includes a first test plate holder mounted to the first test head and including a clamping mechanism, as well as a probe mounting plate mounted to the first test plate holder and retained by the clamping mechanism, the probe mounting plate including a plurality of radially-disposed probe receptacles. The test fixture also includes a plurality of probe assemblies received in corresponding probe receptacles, each of the plurality of probe assemblies, each of the probe assemblies including a probe extending at least partially through the probe mounting plate, each probe electrically connecting to an electrical connection of a twisted pair connector. The test fixture further includes a second test plate holder mounted to the second test head and including a second clamping mechanism, as well as a second probe mounting plate mounted to the second test plate holder and retained by the second clamping mechanism, the second probe mounting plate including a plurality of radially disposed probe receptacles. The test fixture includes a plurality of probe assemblies received in corresponding probe receptacles of the second probe mounting plate, each of the probe assemblies including a probe extending at least partially though the second probe mounting plate and electrically connecting to the twisted pair connector.

DETAILED DESCRIPTION

Figure 1:
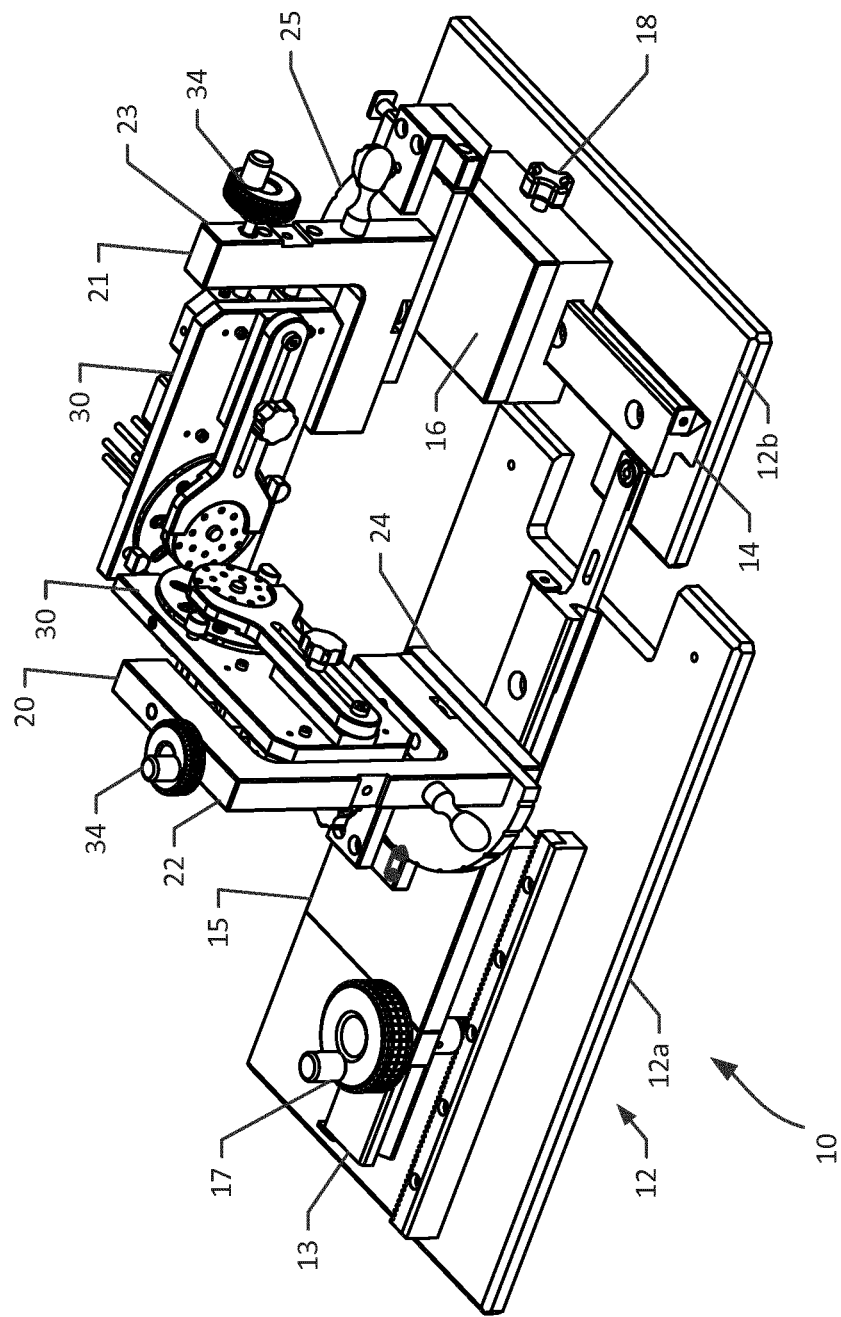
FIG. 1 is a front perspective view of a balunless test fixture, according to an example embodiment.
Figure 2:
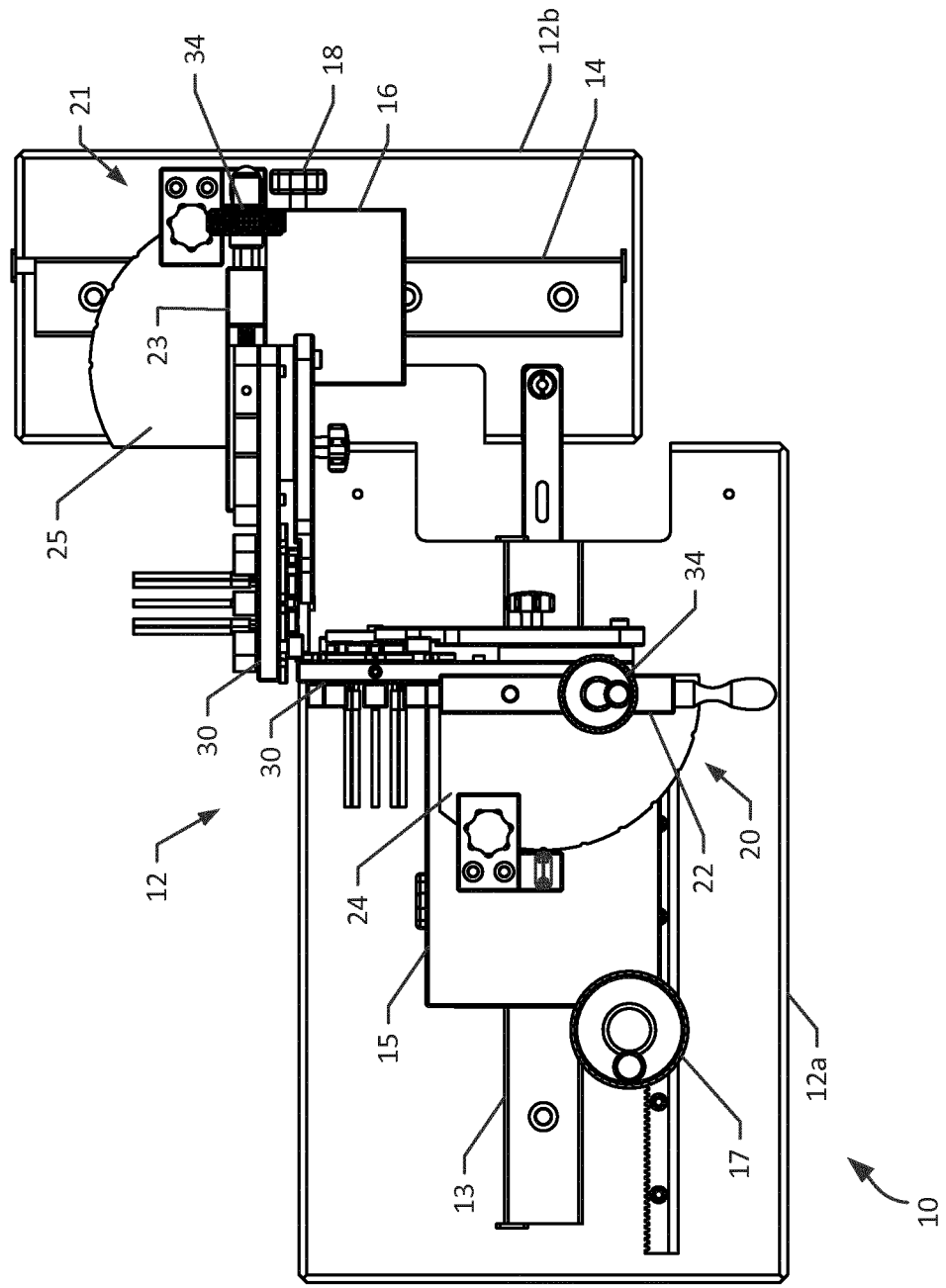
FIG. 2 is a top plan view of the balunless test fixture of FIG. 1.
Figure 3:
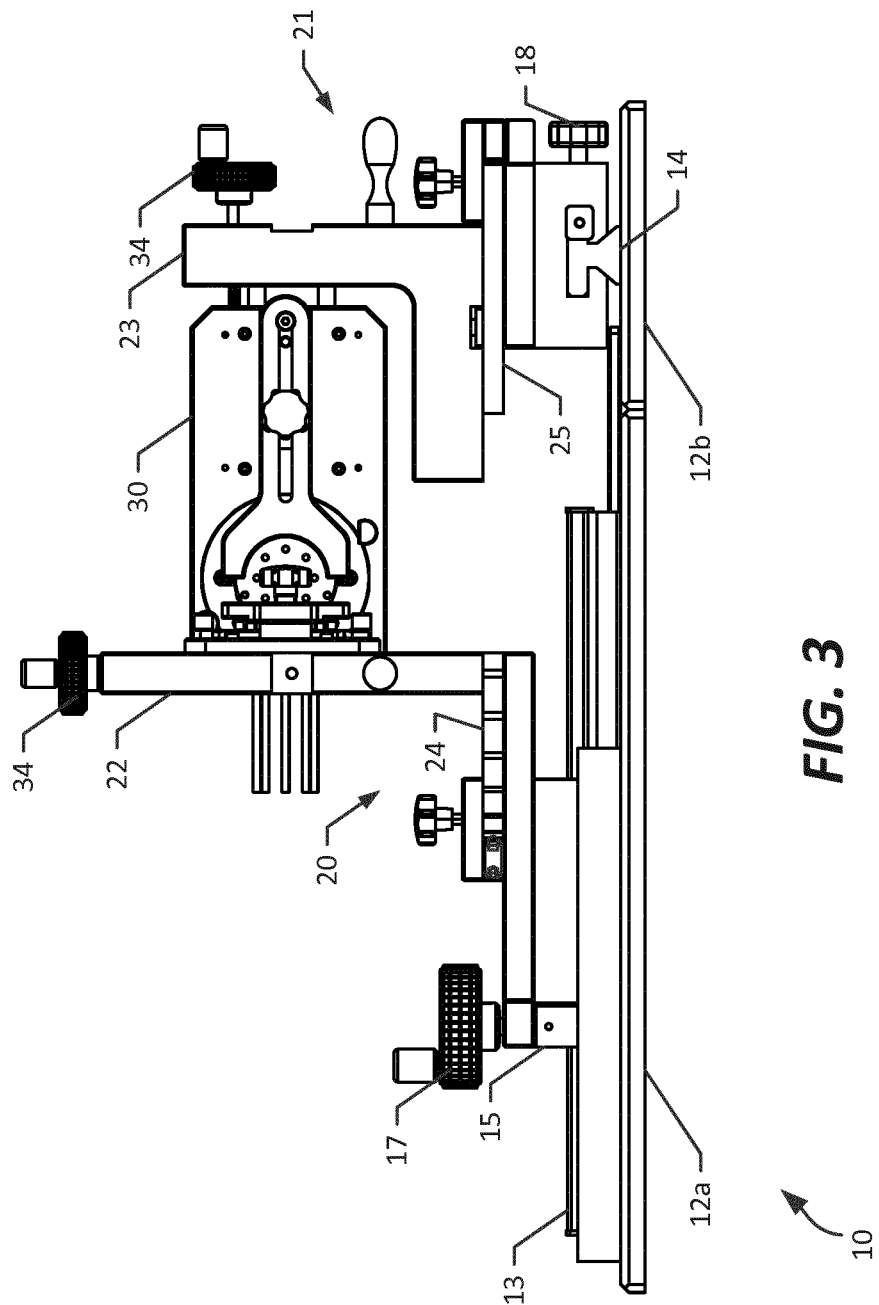
FIG. 3 front plan view of the balunless test fixture of FIG. 1.
Figure 4:
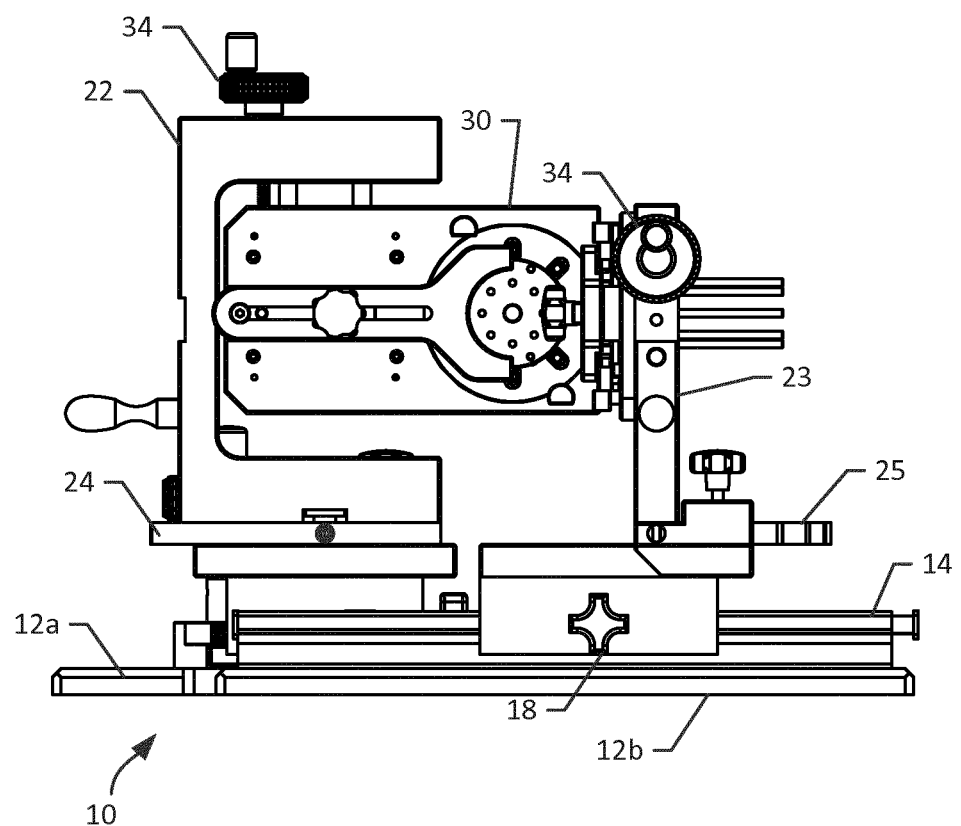
FIG. 4 is a side plan view of the balunless test fixture of FIG. 1.

Various embodiments of the present invention will be described in detail with reference to the drawings, wherein like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

In general the present disclosure relates to a balunless test fixture, such as could be used to test communications or networking equipment used in twisted pair systems. The test fixture features described herein provide for a configurable, adjustable test fixture that is adaptable to a variety of types of designs under test, such as connectors (e.g., RJ-45 plugs, jacks, or combinations thereof), as well as crosstalk compensation circuits, or other types of connectors or cabling to ensure its compliance with relevant ISO/IEC standards. In particular, the present disclosure describes a test fixture that avoids use of baluns and therefore is operable at frequencies up to an exceeding 1 GHz without electrical interference caused by such baluns obscuring the performance of the design under test.

As illustrated in FIGS. 1-4, a test fixture 10 is disclosed. The test fixture 10 includes a test fixture frame 12. The test fixture frame 12 can be constructed from a plurality of sections; in the embodiment shown, the test fixture frame 12 includes first and second sections 12a-b, oriented perpendicularly to each other. The test fixture frame is mountable on any surface convenient for performing electrical testing of a design under test (e.g., a test bench or other testing location). As seen in FIGS. 1-4, the test fixture frame sections 12a-b represent mounting arrangements for test fixture components.

In the embodiment shown in FIGS. 1-4, each of the test fixture frame sections 12a-b includes a guide bar 13, 14, respectively, with a slidable chassis 15, 16, respectively, mounted thereon. The guide bars 13, 14 are oriented perpendicularly to each other, such that the slidable chassis 15, 16 are movable along axes that are perpendicular to each other. In the example embodiments shown, each chassis 15, 16 has a different movement mechanism; chassis 15 uses a dial 17 to cause movement along the guide bar 13, while chassis 16 uses a releasable screw clamp 18, which can be released and reset to move the chassis 16 to a desired position along the guide bar 14.

In the embodiment shown, a first test head 20 is mounted to the first chassis 15, and a second test head 21 is mounted to the second chassis 16. Each of test heads 20, 21 include a pivotable body 22, 23, respectively, extending upwards from respective base plates 24, 25 mounted to the respective chassis 15, 16, to accommodate different orientations or configurations of equipment to be tested.

Each of the test heads 20, 21 are configured to receive a test plate holder 30 mounted thereto. The test plate holder 30 generally is a rectangular-shaped device that can be mounted to the body 22, 23 of one of the test heads 20, 21, and includes a circular cutout at which one or more test plates (e.g., including a probe mounting plate, a termination plate, a probe plate, a load plate, or a calibration plate) can be mounted. The test plate holder 30 includes a clamp 32, shown as a slidable clamp affixed in place by a screw-down clamp, which is used to retain any such test plates in place during operation of the test fixture.

In addition, each of the test heads 20, 21 are configured to include a positional adjustment mechanism 34 useable to control a lateral position of the test plate holder 30. In example embodiments, the test plate holder 30 can be screwed to a mounting bracket extending from the body 22, 23 of one of the test heads 20, 21, and which is movably by way of the positional adjustment mechanism 34. In the embodiment shown, the positional adjustment mechanism 34 includes a dial adjustment however, in alternative embodiments, different types of positional adjustment mechanisms can be used. As illustrated in FIGS. 1-4, the position and orientation of the positional adjustment mechanism 34 on each body 22, 23 can vary; as illustrated, a first mechanism is positioned on a top of body 22, and affects horizontal positioning of a test plate holder 30, while a second mechanism is positioned on a side of body 23, and affects vertical positioning of a corresponding, attached test plate holder 30.

Referring now to FIGS. 5-14, details regarding a test plate holder 30 are provided, according to an example embodiment of the test fixture described herein. As shown and mentioned previously, the test plate holder 30 includes a plate 31 having a clamp 32. The clamp 32 is slidable between an extended position in which it retains test plates in alignment with an opening through the plate 31 sized to receive one or more test plates, and a retracted position in which it does not retain such test plates. Screw down clamp 33 retains the clamp 32 in place, in any position between the extended position and a fully-retracted position.

In addition to the clamp 32 retention mechanisms 36 can be included on the plate 31 near the opening sized to receive test plates. The retention mechanisms can include, for example, a rotatable partial disk that can be rotated when a disk is present such that a rounded edge of the partial disk engages a test plate (e.g., as seen in FIG. 6), or rotated such that a flat portion of the partial disk is positioned along a perimeter of the test plate, such that the retention mechanism no longer retains the test plate.

Figure 5:
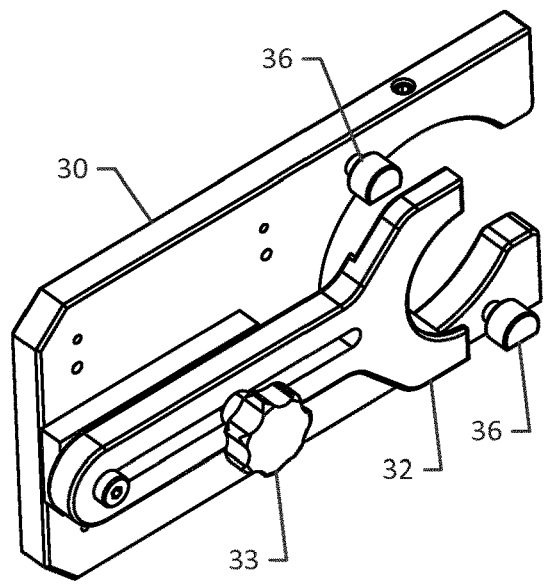
FIG. 5 is a perspective view of a test plate holder useable in the balunless test fixture of FIG. 1.
Figure 6:
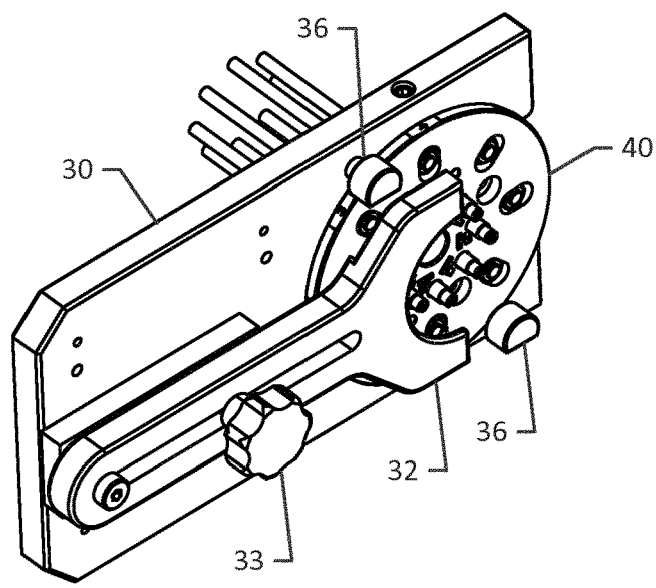
FIG. 6 is a perspective view of the test plate holder of FIG. 5 with a probe plate installed thereon.
Figure 7:
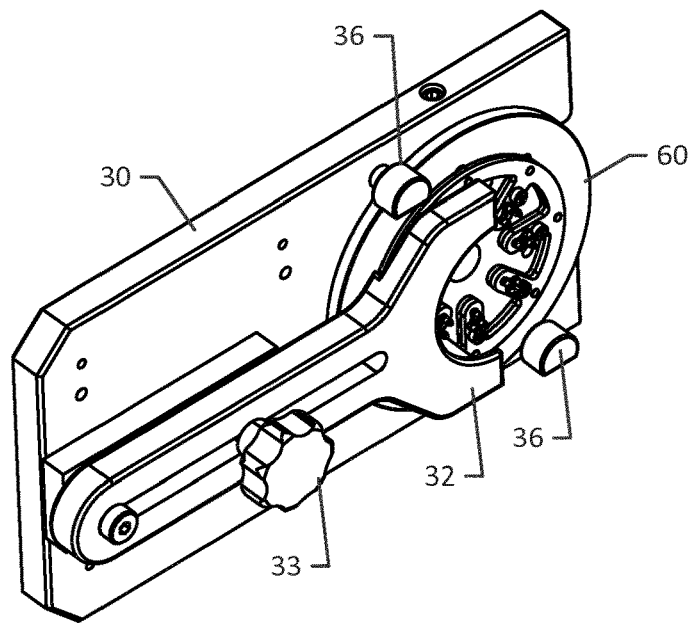
FIG. 7 is a perspective view of the test plate holder of FIG. 5 with a probe mounting plate and termination plate mounted thereto.
Figure 8:
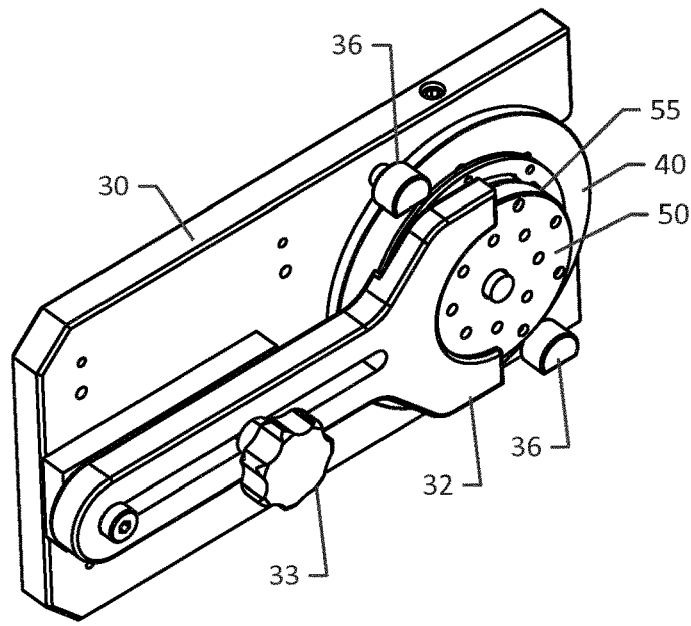
FIG. 8 is a perspective view of the test plate holder of FIG. 5 with a probe mounting plate, clamp plate, and termination plate mounted thereto.
Figure 9:
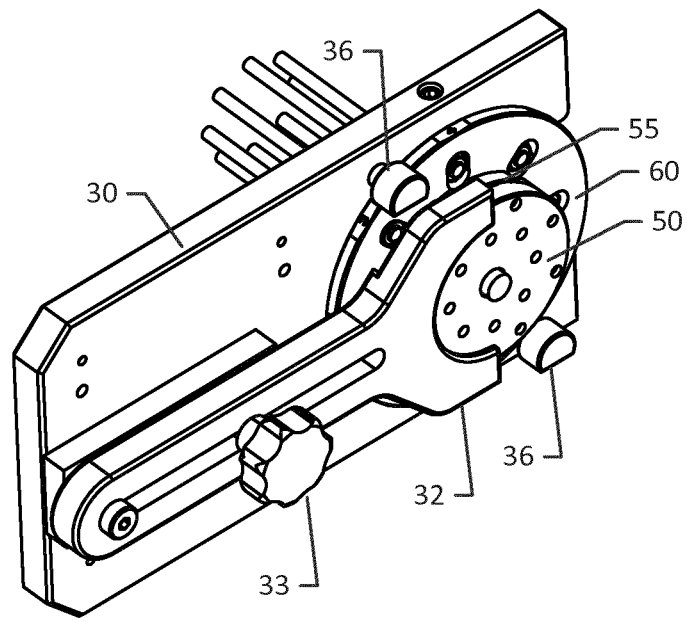
FIG. 9 is a perspective view of the test plate holder of FIG. 5 with a probe mounting plate, clamp plate, and termination plate mounted thereto, with leads extending from the probe plate.
Figure 10:
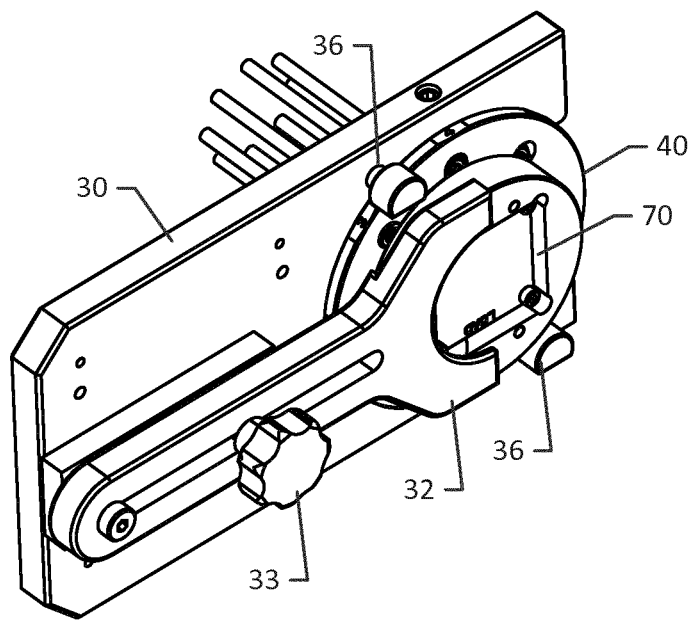
FIG. 10 is a perspective view of the test plate holder of FIG. 5 with a probe mounting plate and test plate mounted thereto.
Figure 11:
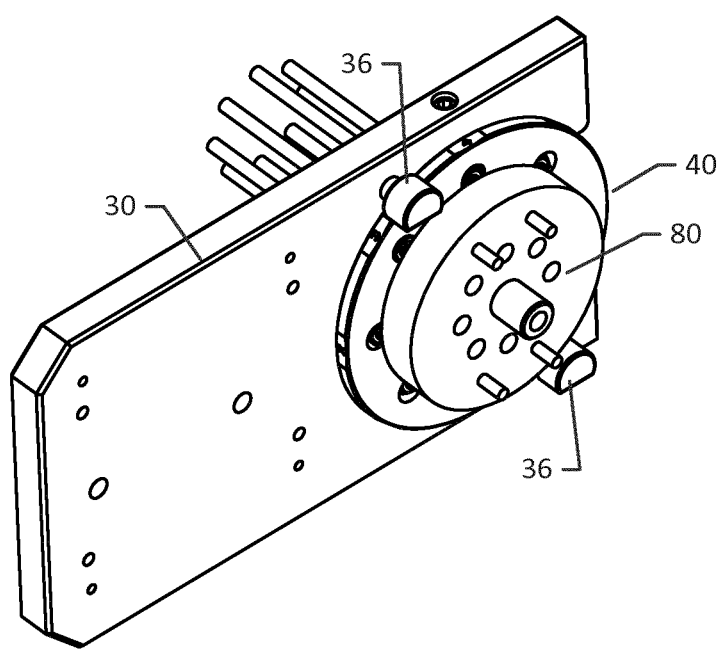
FIG. 11 is a perspective view of the test plate holder of FIG. 5 with a probe mounting plate and calibration plate mounted thereto, with leads extending from the probe mounting plate.
Figure 12:
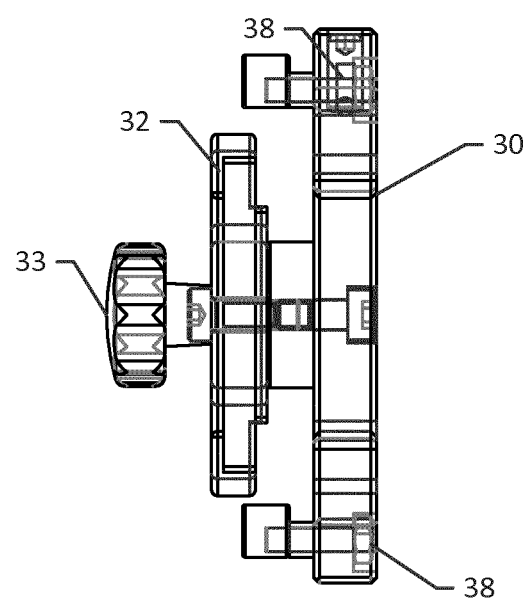
FIG. 12 is a side plan view of the test plate holder of FIG. 5.
Figure 13:
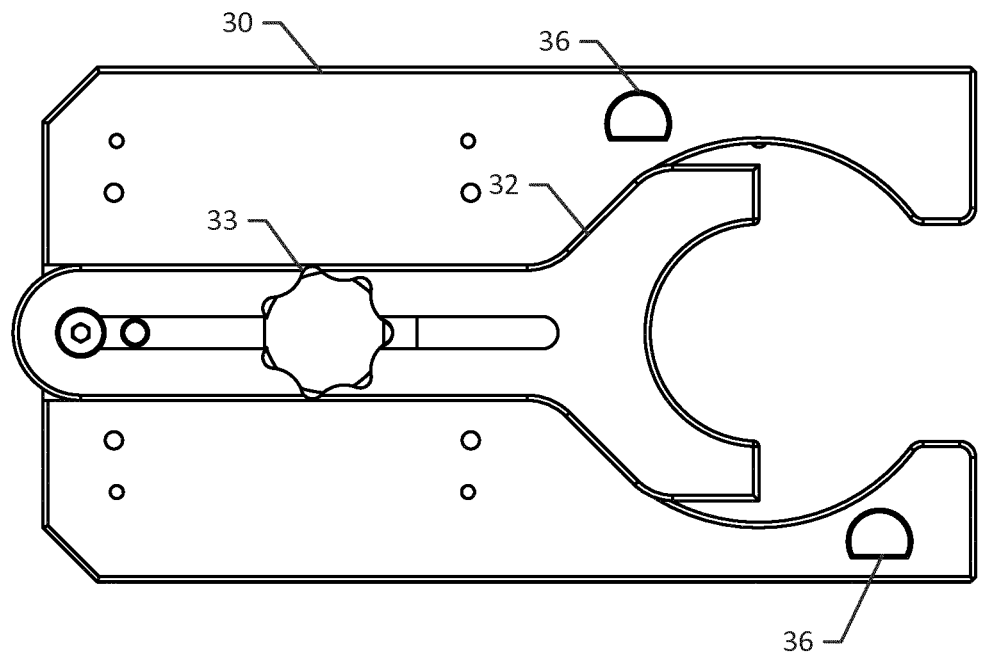
FIG. 13 is a front plan view of the probe mounting plate of FIG. 5.
Figure 14:
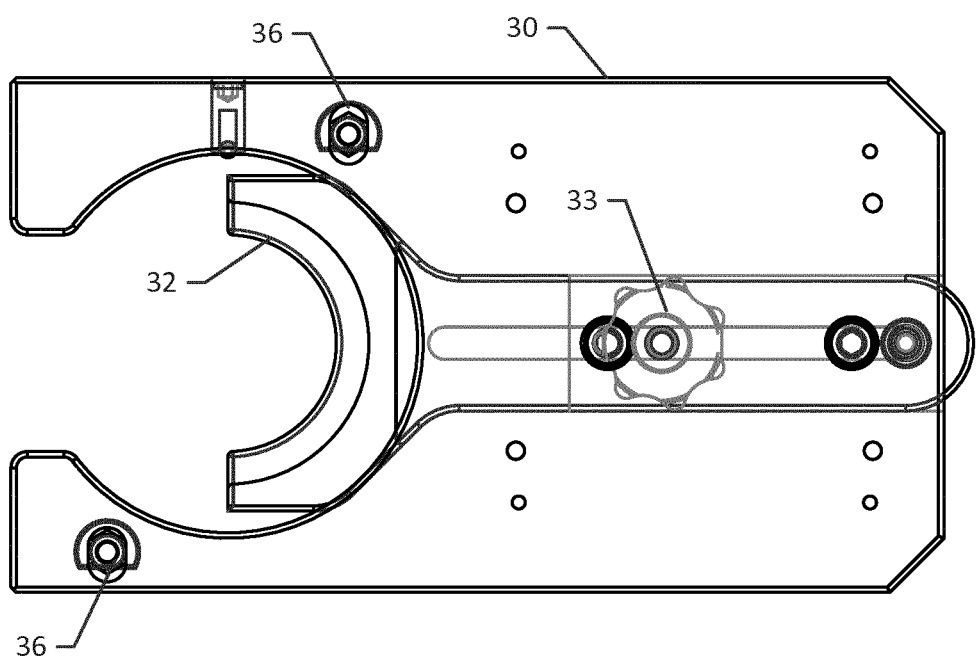
FIG. 14 is a rear plan view of the probe mounting plate of FIG. 5.
Figure 23:
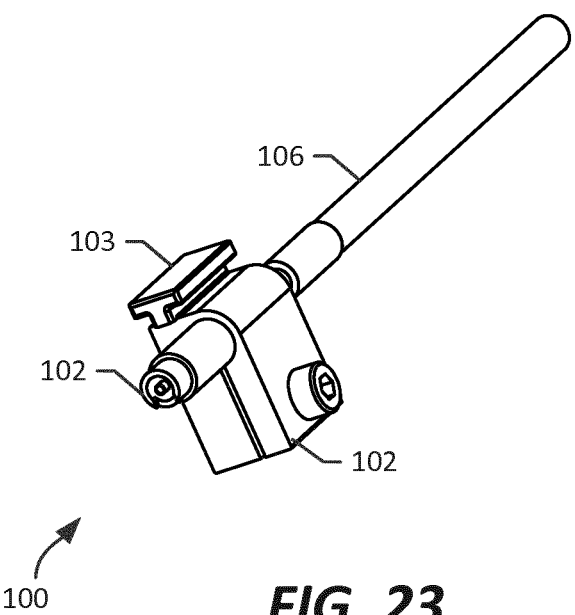
FIG. 23 is a perspective view of a probe clamp and associated electrical probe useable in the balunless test fixture described herein.
Figure 24:
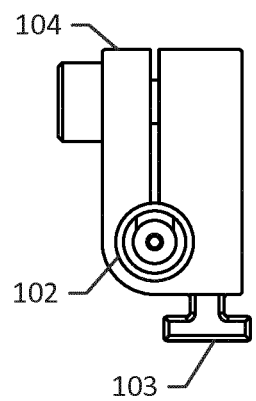
FIG. 24 is a front plan view of the probe clamp and electrical probe of FIG. 23.
Figure 25:
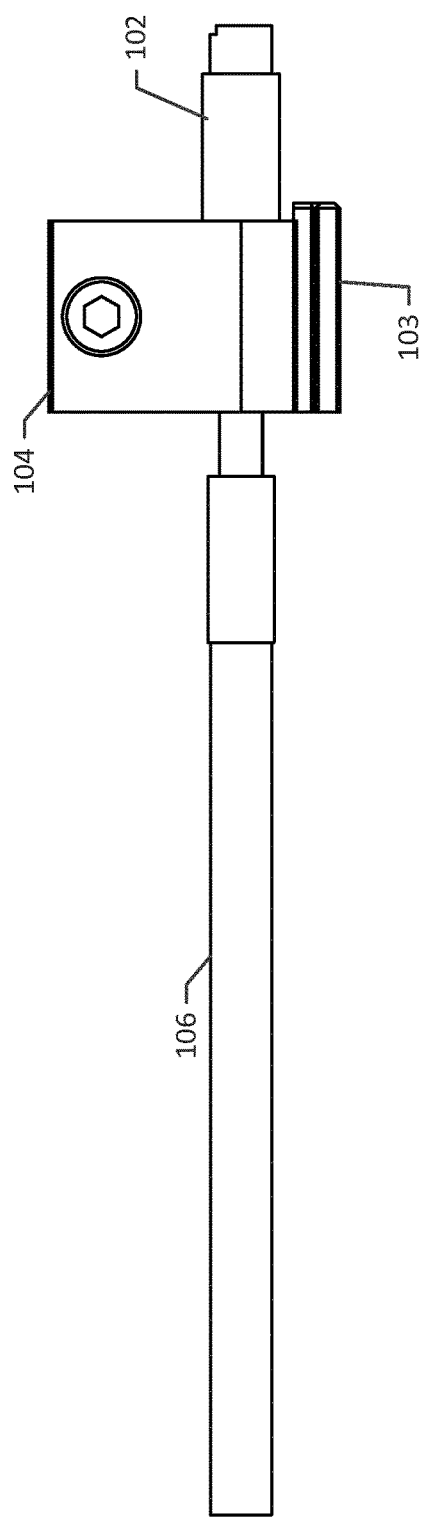
FIG. 25 is a side plan view of the probe clamp and electrical probe of FIG. 23.
Figure 26:
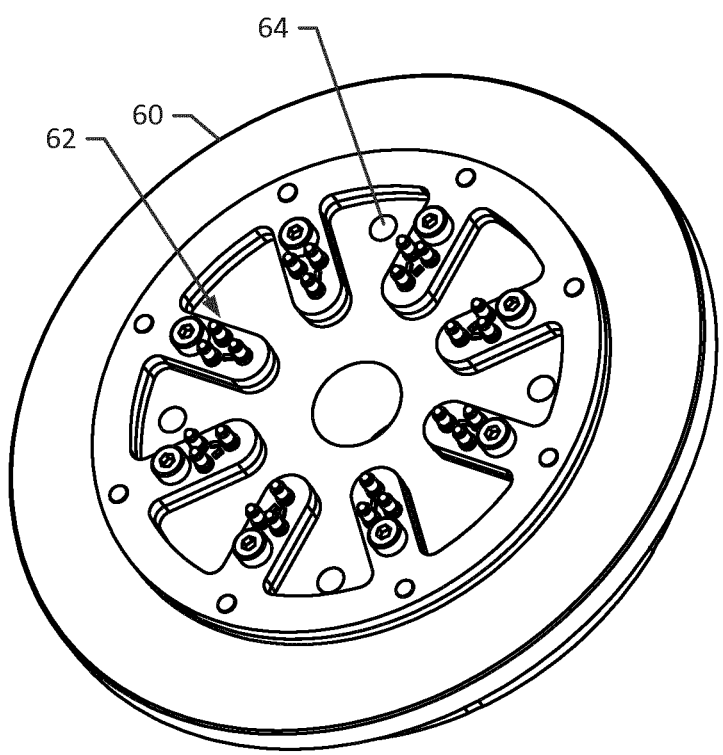
FIG. 26 is a perspective view of a termination plate useable in the balunless test fixture described herein.
Figure 27:
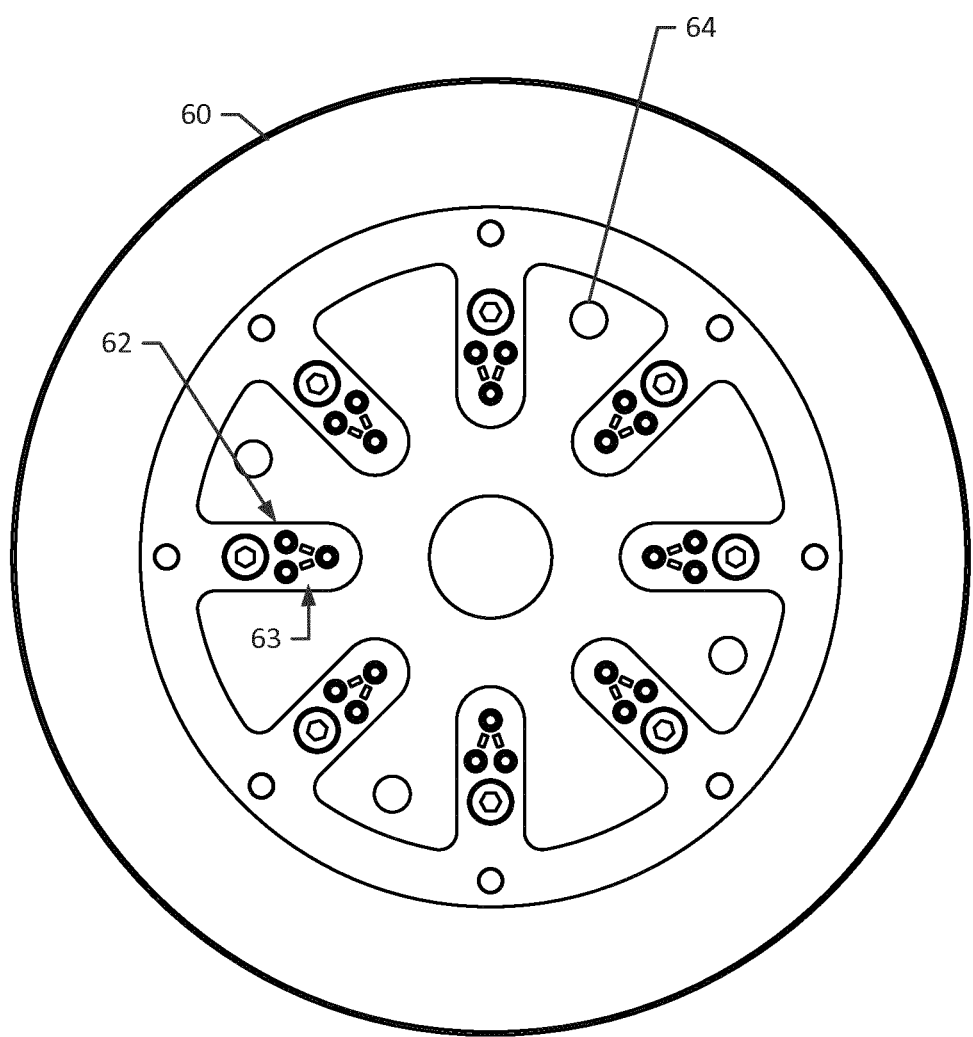
FIG. 27 is a front plan view of the termination plate of FIG. 26.
Figure 28:
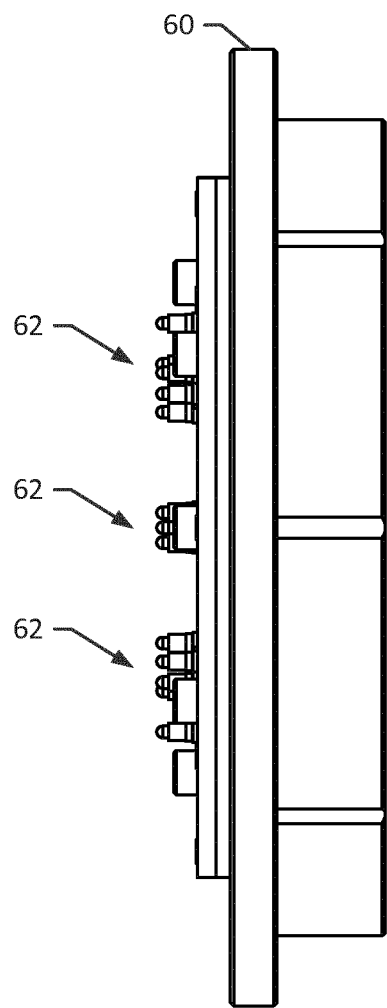
FIG. 28 is a side plan view of the termination plate of FIG. 26.
Figure 29:
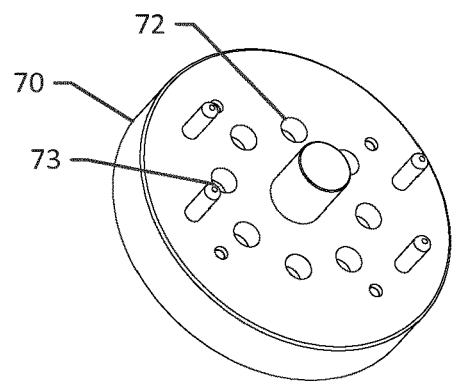
FIG. 29 is a front perspective view of a load plate useable in the balunless test fixture described herein.
Figure 30:
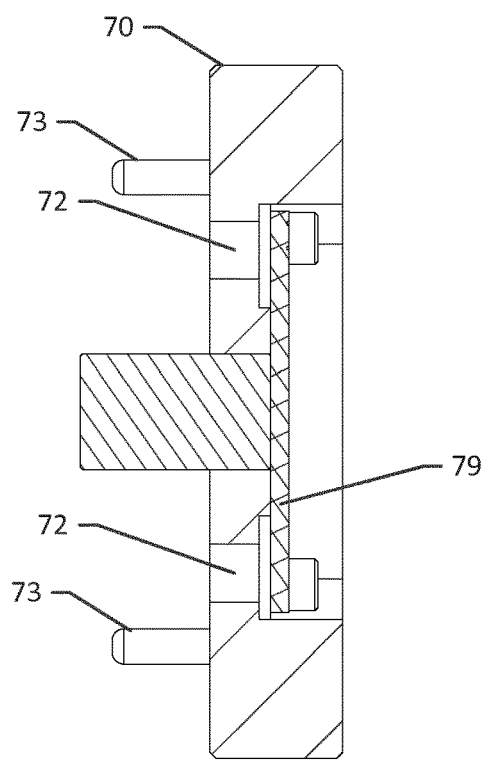
FIG. 30 is a side perspective view of the load plate of FIG. 29.
Figure 31:
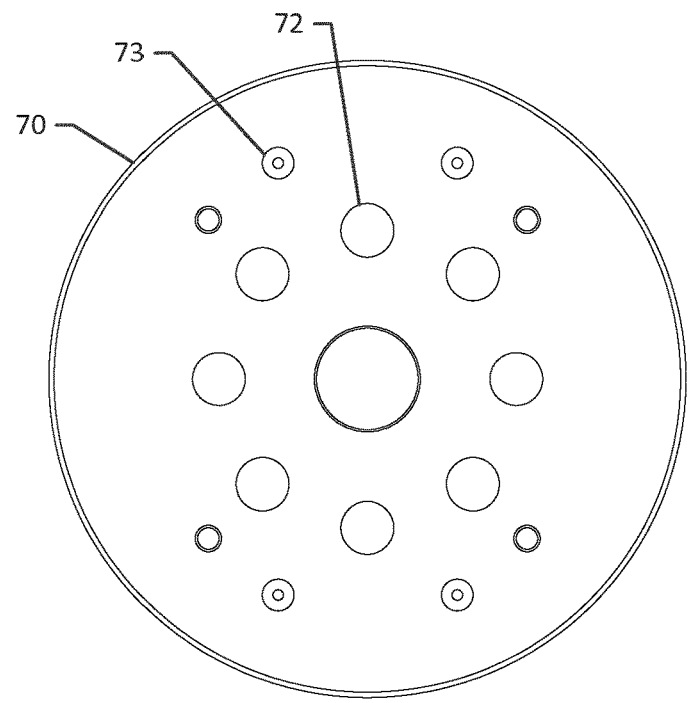
FIG. 31 is a front plan view of the load plate of FIG. 29.
Figure 32:
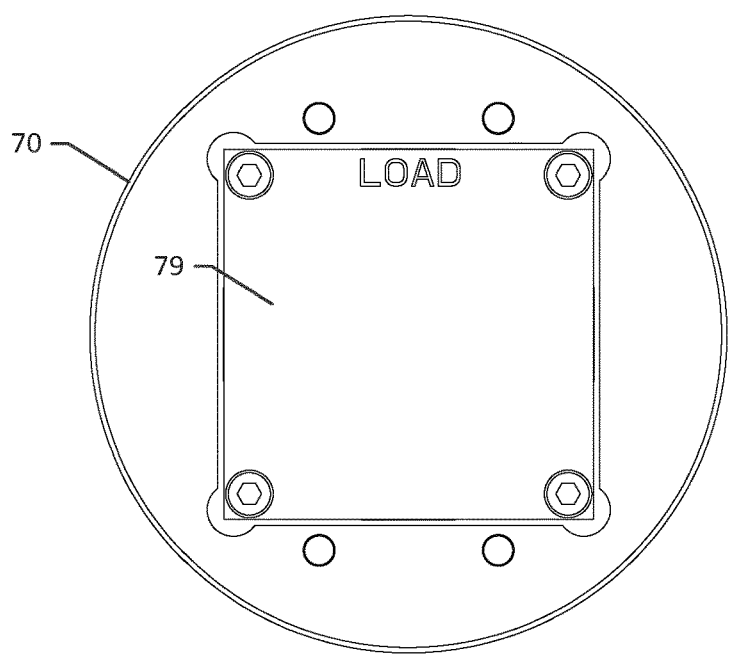
FIG. 32 is a rear plan view of the load plate of FIG. 29.

Still referring to FIGS. 5-12, it is noted that a plurality of different types of test plates can be retained by the test plate holder 30, and that a plurality of such test plates are typically included. FIGS. 5 and 13-14 illustrate the test plate holder 30 with no test plates present. FIG. 6 illustrates the test plate holder 30 with a probe mounting plate 40 and associated probe assemblies 100 mounted thereto; the probe mounting plate 40 is illustrated in further detail in FIGS. 15-18, with a probe plate 50 and clamp plate 55 useable in connection with the probe mounting plate illustrated in FIGS. 19-22. Probe assemblies 100, extendable through the probe plate, are seen in FIGS. 23-25. FIGS. 7 and 26-28 show the use of a termination plate 60 in place of the probe mounting plate of FIG. 6. FIG. 8 illustrates use of the probe plate 50 and clamp plate 55 in association with a termination plate 60, which is also seen in FIGS. 29-32; FIG. 9 shows use of the probe plate 50 and clamp plate 55 with a probe mounting plate 40 rather than the termination plate 60, with probe assemblies 100 extending from the probe mounting plate 40. FIG. 10 illustrates installation of a load plate 70 in place of the probe plate 50 mounted to the probe mounting plate 40, which is useable for some types of designs under test. FIG. 11 illustrates installation of a calibration plate 80 on the probe mounting plate 40, operation of which is described below in connection with FIGS. 33-35.

Specifically referring to FIGS. 6 and 15-18, a probe mounting plate 40 includes a plurality of probe mounting locations 42, disposed radially around the plate at a common distance from a center axis. In the embodiment shown, eight separate probe mounting locations 42 are included; in alternative embodiments, other numbers of probe mounting locations, and therefore different numbers of probes, could be used. In the embodiment shown, eight probe locations are useable to test each of the eight wires of a typical RJ-45 connector.

Figure 16:
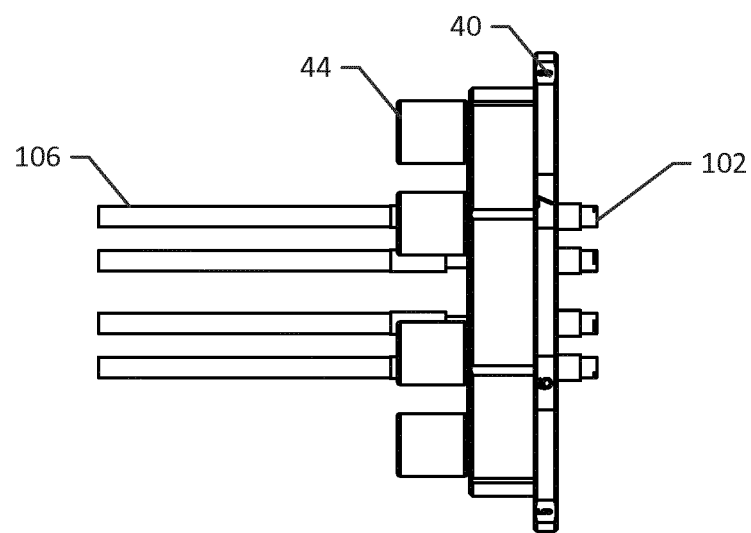
FIG. 16 is a cross-sectional view of the clamp plate and probe plate, with an associated design under test.
Figure 17:
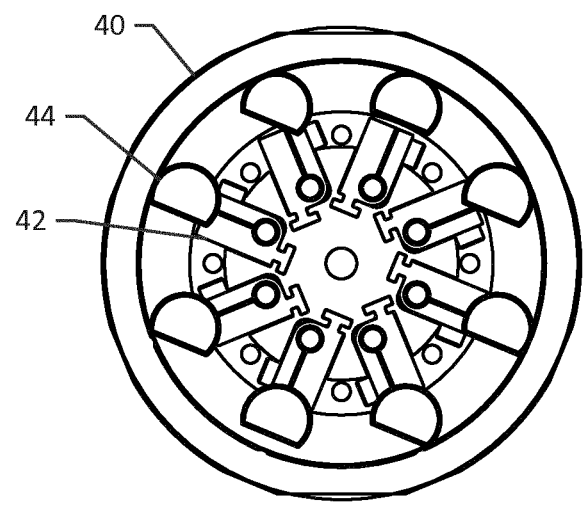
FIG. 17 is a front plan view of the interconnected clamp plate and probe plate of FIG. 16.
Figure 18:
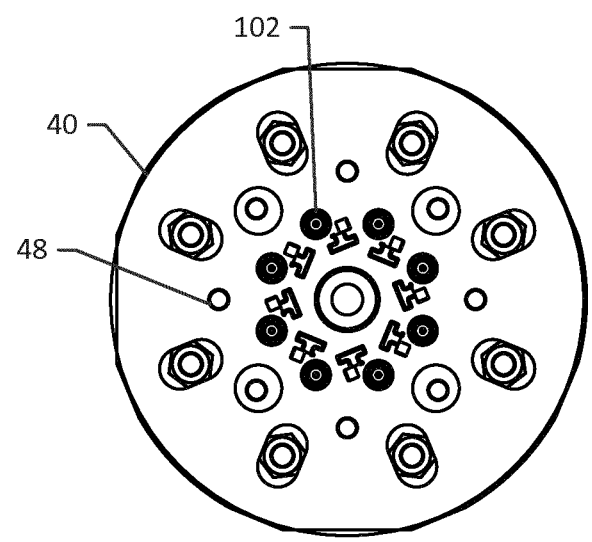
FIG. 18 is a rear plan view of the probe plate shown in FIG. 16.
Figure 19:
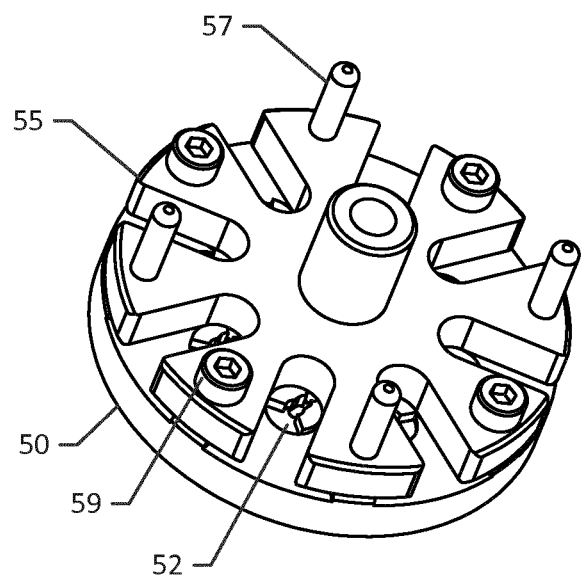
FIG. 19 is a rear perspective view of the probe mounting plate with leads of probe assemblies extending from the probe plate.
Figure 20:
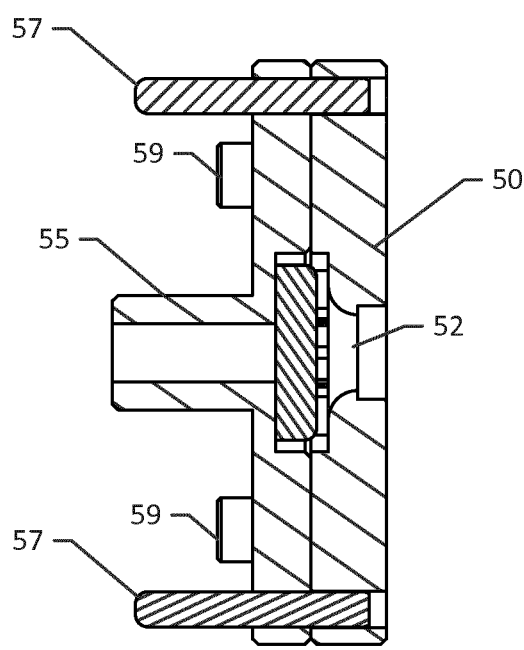
FIG. 20 is a side plan view of probe mounting plate and associated leads extending therefrom as seen in FIG. 19.
Figure 21:
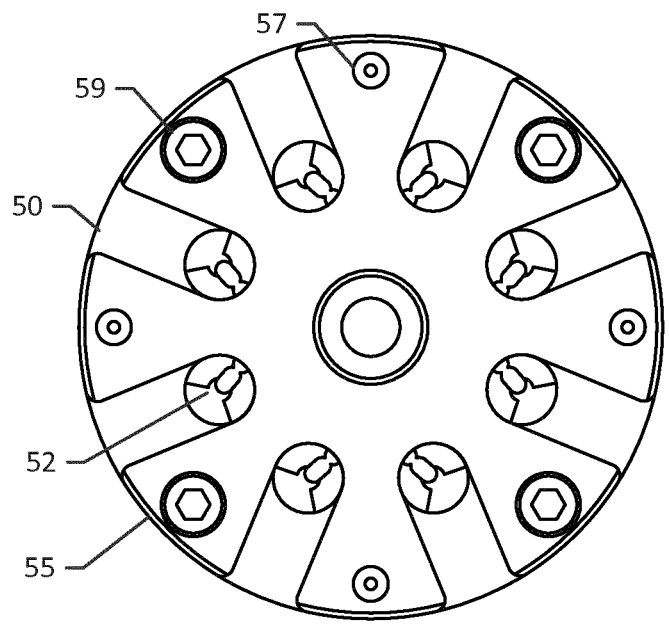
FIG. 21 is a rear plan view of the probe mounting plate of FIG. 19.
Figure 22:
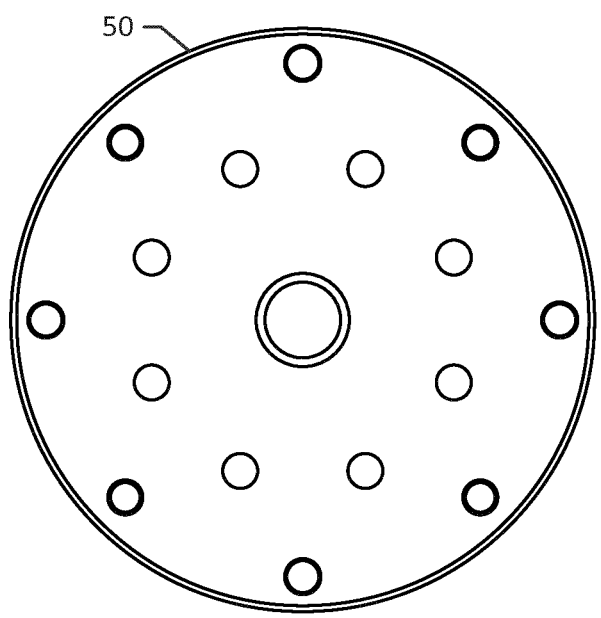
FIG. 22 is a front plan view of the probe mounting plate of FIG. 19.

As seen in FIGS. 15-18 specifically, probe retention clips 44 are positioned on a rear side (i.e., a side opposite the side to which a design under test is connected) of the probe mounting plate 40. The probe retention clips 44 are rotatable, semi-circular disk shapes which are rotatable to retain probe assemblies mounted in the probe mounting plate 40. When retained, the probe assemblies 100 extend through the probe mounting plate 40 at a predetermined distance to electrically contact terminals positioned on one or more other plates, such as a probe plate 50 and associated clamp plate 55, or a load plate 70, as discussed below. As seen in FIG. 18, the probe retention clips are bolted through the prove mounting plate (showing recessed nut connected to a portion of the probe retention clip extending through the probe mounting plate 40.

As seen in FIGS. 17-18, each of the probe mounting locations 42 is specifically sized and configured such that it is designed to receive a probe assembly 100. As noted below, each probe assembly includes a body 104 that is keyed, such that any probe assembly can be received into each probe mounting location 42 in a specific orientation. This ensures accurate and equal positioning of probes through openings 46 through the probe mounting plate 40.

When mounted to the test plate holder 30, the probe mounting plate 40 is rotatable to any of a plurality of fixed rotational positions. In particular, and referring back to FIG. 12, the test plate holder 30 can include a ball plunger integrated therein, and which can be used to retain one or more test plates, such can be held in position through use of a ball plunger 38, which maintains a radial location of one or more test plates, when held by the test plate holder 30. In example embodiments, and as best seen in FIGS. 15-16, the ball plunger 38 engages with a detent in an edge of the probe mounting plate 40 at any of a plurality of fixed positions, thereby allowing for preventing rotation of the probe mounting plate 40 during testing of a design under test, while also allowing for disengagement of the ball plunger to allow for selective rotation to one or more different rotational positions as desired to accommodate various designs to be tested.

Figure 15:
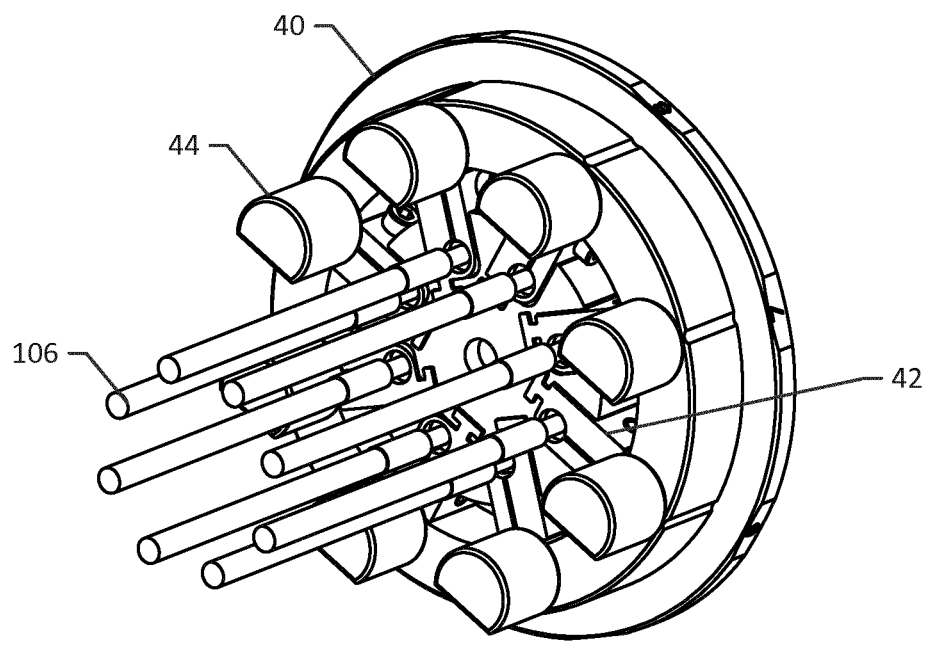
FIG. 15 is a perspective view of the clamp plate and probe plate interconnected.

As seen in FIGS. 6 and 15-16, a probe plate 50 and clamp plate 55 can be interconnected, and mounted to the probe mounting plate 40 for affixing a design under test to the probe mounting plate 40. The clamp plate includes extensions 57 that are inserted into the probe plate 50 to maintain a common rotational position with the test plate, which also act as location pins that can be used to align the clamp plate 55 to the probe mounting plate 40, at holes 48 in the probe mounting plate 40. The clamp plate 55 can be screwed down to the probe plate 50 using screws 59. Designs under test can be mounted to the probe plate 50 on a side opposite the clamp plate 55, and leads from such designs under test can extend through a center opening 52 of the clamp plate to electrode position 52 that directly contact probe tips of electrical probes extending through the probe mounting plate 40.

Referring to FIGS. 23-25, details regarding probe assemblies 100 are shown. The probe assemblies 100 each include a probe tip 102, body 104, and probe conduit 106. The body 104 is sized and shaped to be received into probe mounting locations 42, and includes a keyed protrusion 103 that is retained by the probe mounting plate 40 in a complementary slot in the probe mounting locations 42. The probe tip 102 electrically connects to the probe conduit 106 to form a coaxial probe. The probe tip 102 is spring-biased forward to press against an electrode position, such as electrode positions 52 of the probe plate 50.

In example embodiments, the probe assemblies have a three amp current rating, as well as 50 Ohms of nominal impedance. Probe tips 102 form an SMA termination at the electrode position, and can be constructed from a gold-plated brass or other equivalent resilient, conductive metallic material.

As seen in FIGS. 7 and 26-28, a termination plate 60 can be used in place of the probe mounting plate 40, and can be used to test specific surface mount designs under test, mounted to either a probe plate 50 or a load plate 70. The termination plate 60 includes a plurality of surface mount contact probes 62 that can directly contact a design under test or to leads extending through a probe plate 50 or load plate 70. In association with the surface mount contact probes 62, one or more circuit elements can be mounted on the termination plate 60, such as resistor loads 63 intended to provide specific resistances to be tested in connection with the design. The termination plate 60 further includes openings 64 to receive pins, or extensions 57 of the probe plate 50 and clamp plate 55. The termination plate 60 is also rotatable, similarly to the probe mounting plate 40, through a number of discrete positions, and can be affixed in a particular rotational position by the ball plunger 38.

FIGS. 29-32 show a load plate 70 that can be used in place of the probe plate 50 for other types of designs under test. Load plate 70 can specifically be used, for example in connection with termination plate 60 or probe mounting plate 40, to test electrical characteristics of surface mount circuit designs, such as those that may be located on a circuit board to be tested. The load plate 70 allows for direct testing or probing of terminations on the calibration plane, i.e., at a known distance from a probe tip. In the embodiment shown, the load plate 70 includes a plurality of openings 72 through which probe tips 102 can extend to contact a design under test, shown as a load circuit board 79, which can be screwed down to or otherwise affixed to the load plate (e.g., using screws as shown). The load plate 70 further includes alignment pins 73 that can be used to align the load plate when mounting to either a termination plate 60 or probe mounting plate 40.

Figure 33:
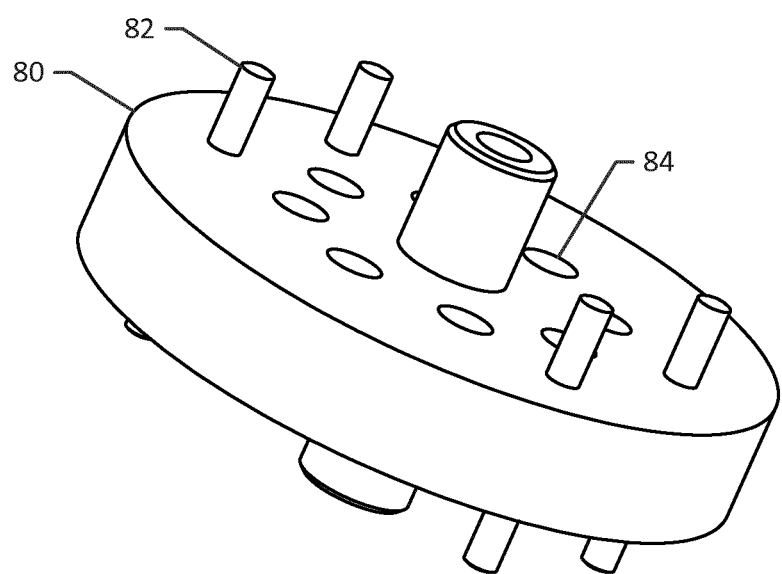
FIG. 33 is a perspective view of a calibration plate useable in the balunless test fixture described herein.
Figure 34:
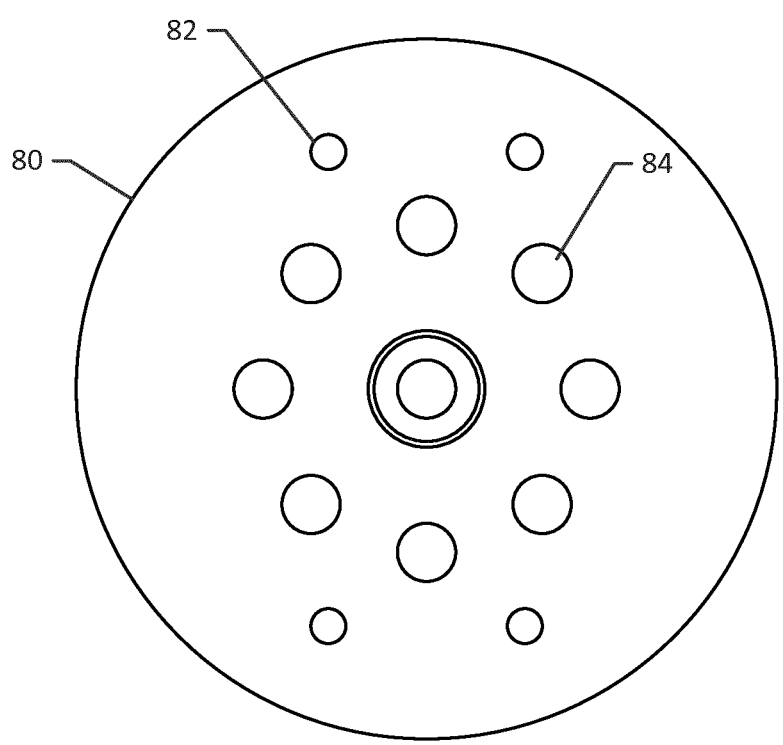
FIG. 34 is a front plan view of the calibration plate of FIG. 33.
Figure 35:
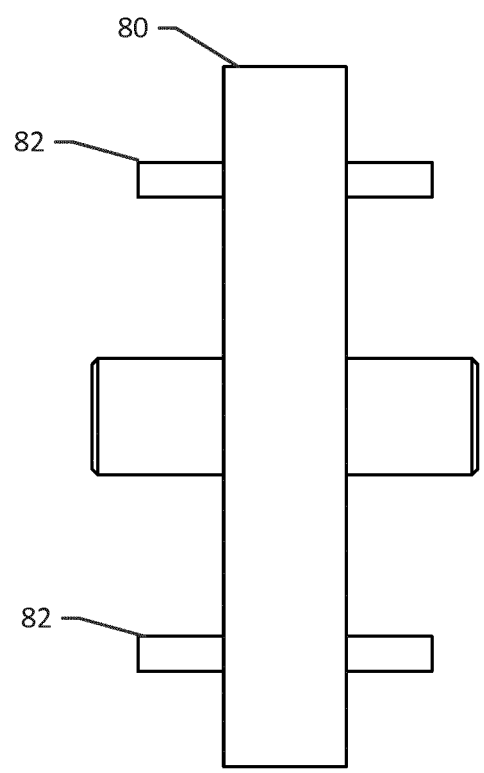
FIG. 35 is a side plan view of the calibration plate of FIG. 33.

FIGS. 33-35 illustrate a calibration plate 80 useable in connection with either the probe mounting plate 40 or termination plate 60. The calibration plate 80 enables alignment and isolation of a probe mounting plate 40 to facilitate calibration of the probes, for example to determine an amount of noise occurring between the probes and which can be discounted from the observations of a design under test. In the embodiment shown, the calibration plate 80 includes alignment pins 82, as well as openings 84 through which each of the probe tips 102 extend. However, because the calibration plate does not include a load, it is simply used as a baseline for crosstalk occurring between probes.

Referring to FIGS. 1-35 generally, it is noted that the test fixture 10, and in particular the balunless test arrangements mountable to the test plate holder 30, provide for substantial flexibility in determining an electrical performance, and in particular a crosstalk performance, of a design under test. In particular, the test fixture 10 allows for testing of electrical connectors and other designs under test at frequencies up to and exceeding 1 GHz, without encountering crosstalk or common mode effects that would otherwise be present if a balun-based test fixture were used. Additionally, the configurable nature of the different plates and types of components that can be tested, allows for substantial flexibility when testing such components. Additional advantages are present as well, and are apparent in the configurations discussed above, and in the below-listed claims.

The above specification, examples and data provide a complete description of the manufacture and use of the composition of the invention. Since many embodiments of the invention can be made without departing from the spirit and scope of the invention, the invention resides in the claims hereinafter appended.

The invention claimed is:

1. A test fixture for electrical equipment, the test fixture comprising:
   a test fixture frame including:
      a first test fixture mount having a first test head mounted thereon, the first test head slidable along a first axis; and
      a second test fixture mount having a second test head mounted thereon, the second test head slidable along a second axis perpendicular to the first axis;
   a first test plate holder mounted to the first test head, the first test plate holder including a clamping mechanism;
   a second test plate holder mounted to the second test head, the second test plate holder including a second clamping mechanism;
   a first probe mounting plate mounted to the first test plate holder and retained by the clamping mechanism, the first probe mounting plate including a plurality of radially-disposed probe receptacles;
   a second probe mounting plate mounted to the second test plate holder and retained by the second clamping mechanism, the second probe mounting plate including a plurality of radially disposed probe receptacles;
   a plurality of probe assemblies received in corresponding probe receptacles, each of the probe assemblies including a probe extending at least partially through the first probe mounting plate, each probe electrically connecting to a design under test;
   a second plurality of probe assemblies received in corresponding probe receptacles of the second probe mounting plate, each of the probe assemblies including a probe extending at least partially though the second probe mounting plate and electrically connecting to the design under test;

wherein the plurality of probe assemblies delivers electrical signals to the design under test to test crosstalk performance of the design under test.

2. The test fixture of claim 1, wherein the design under test comprises an electrical connection including a plug and a jack.

3. The test fixture of claim 1, wherein the clamping mechanism is slidable between retaining and retracted positions, and is affixable in place by a screw.

4. The test fixture of claim 1, further comprising a calibration plate mountable to the first probe mounting plate and useable to calibrate measurements of electrical characteristics of the test fixture.

5. The test fixture of claim 1, further comprising a termination plate positioned on the first probe mounting plate, the termination plate used to retain the design under test.

6. The test fixture of claim 5, wherein the design under test is positioned on a load plate having common electrical characteristics to a calibration plate.

7. The test fixture of claim 6, wherein the design under test includes a crosstalk compensation circuit.

8. The test fixture of claim 5, further comprising a probe plate mounted to the first probe mounting plate, the probe plate including a plurality of electrical pads for connection of the design under test thereto.

9. The test fixture of claim 8, wherein the termination plate further includes one or more contact probes electrically connectable to the electrical pads of the probe plate.

10. The test fixture of claim 1, wherein each probe comprises a coaxial test cable probe.

11. The test fixture of claim 1, wherein the first probe mounting plate includes a plurality of probe assembly retention clamps used to retain the probe assemblies in the corresponding plurality of radially-disposed probe receptacles.

12. The test fixture of claim 1, wherein the first probe mounting plate is rotatable to a plurality of discrete positions when mounted to the first test plate holder.

13. The test fixture of claim 1, wherein the first test fixture mount includes a first vertical positioner useable to adjust a vertical position of the first test plate holder, and the second test fixture mount includes a second vertical positioner useable to adjust a vertical position of the second test plate holder.

14. A method of testing electrical performance of an electrical connector, the method comprising:

mounting a probe mounting plate to a test plate holder retained by a test head of a test fixture mount, the probe mounting plate including a plurality of radially-disposed probe receptacles having a plurality of probe assemblies received therethrough, each probe assembly including a coaxial probe;

mounting a probe plate to a termination plate and the probe mounting plate, the probe plate having a design under test mounted thereto, wherein mounting the probe plate and termination plate to the probe mounting plate electrically connects the design under test to the coaxial probes of the plurality of probe assemblies;

mounting a second probe mounting plate to a second test plate holder retained by a second test head of a second test fixture mount oriented perpendicularly to the test fixture mount, the second probe mounting plate including a plurality of radially-disposed probe receptacles having a plurality of probe assemblies received therethrough, each probe assembly including a coaxial probe;

mounting a second probe plate to a second termination plate and the second probe mounting plate, the second probe plate electrically connected to the design under test such that the second probe mounting plate electrically connects the design under test to the coaxial probes of the plurality of probe assemblies associated with the second probe mounting plate;

clamping the probe plate, termination plate, and probe mounting plate to the test plate holder using a slidable clamping mechanism;

clamping the second probe plate, second termination plate, and second probe mounting plate to the second test plate holder using a second slidable clamping mechanism; and testing crosstalk performance of the design under test based on signals sent or received via the probe assemblies.

15. The method of claim 14, further comprising adjusting a vertical and horizontal position of the first and second test heads to align with a design under test.

16. A test fixture for testing signal performance of a twisted pair connector, the test fixture comprising:

a test fixture frame including:
a first test fixture mount having a first test head mounted thereon, the first test head slidable along a first axis; and
a second test fixture mount having a second test head mounted thereon, the second test head slidable along a second axis perpendicular to the first axis;

a first test plate holder mounted to the first test head, the first test plate holder including a clamping mechanism;

a probe mounting plate mounted to the first test plate holder and retained by the clamping mechanism, the probe mounting plate including a plurality of radially-disposed probe receptacles;

a plurality of probe assemblies received in corresponding probe receptacles, each of the probe assemblies including a probe extending at least partially through the probe mounting plate, each probe electrically connecting to an electrical connection of a twisted pair connector;

a second test plate holder mounted to the second test head, the second test plate holder including a second clamping mechanism;

a second probe mounting plate mounted to the second test plate holder and retained by the second clamping mechanism, the second probe mounting plate including a plurality of radially disposed probe receptacles;

a plurality of probe assemblies received in corresponding probe receptacles of the second probe mounting plate, each of the probe assemblies including a probe extending at least partially though the second probe mounting plate and electrically connecting to the twisted pair connector;

wherein the plurality of probe assemblies delivers electrical signals to the twisted pair connector to test crosstalk performance of the twisted pair connector.

17. The system of claim 16, further comprising a first probe plate mounted to a twisted pair electrical jack, and a second probe plate mounted to a twisted pair electrical plug mated to the twisted pair electrical jack.

18. The system of claim 17, wherein each of the probes comprise coaxial probes that electrically connect to test pads of the first and second probe plates, respectively, via contact probes of the first and second termination plates.

\* \* \* \* \*